United States Patent [19]

Koslar

[11] 4,298,837

[45] Nov. 3, 1981

[54] HAND HELD TESTING DEVICE FOR MEASURING DIFFERENT ELECTRICAL QUANTITIES

[75] Inventor: Manfred Koslar, Rheda-Wiedenbrueck, Fed. Rep. of Germany

[73] Assignee: Siemens Aktiengesellschaft, Berlin & Munich, Fed. Rep. of Germany

[21] Appl. No.: 136,360

[22] Filed: Apr. 1, 1980

[30] Foreign Application Priority Data

Apr. 11, 1979 [DE] Fed. Rep. of Germany ........ 2914761

[51] Int. Cl.$^3$ ............................................. G01R 31/02
[52] U.S. Cl. .................. 324/72.5; 324/99 D
[58] Field of Search .................... 324/72.5, 158 P, 133, 324/99 D

[56] References Cited

U.S. PATENT DOCUMENTS

| | | | |
|---|---|---|---|
| 3,452,277 | 6/1969 | Woroble | 324/72.5 |
| 3,555,420 | 1/1971 | Schwartz | 324/72.5 |
| 3,893,028 | 7/1975 | Febvre | 324/72.5 |

*Primary Examiner*—Michael J. Tokar
*Attorney, Agent, or Firm*—Spellman, Joel & Pelton

[57] ABSTRACT

There is disclosed a hand held testing device for measuring different electrical quantities. Two handles equipped with test prongs are interconnected by a cable. A battery and means for charging the same are built into one handle. The other handle is provided with a function selecting switch and a range selecting switch having finger grip elements. Movable switch elements are constructed of contact rollers. The stationary switch elements are commonly formed of a printed circuit board bearing respective contact areas. A second printed circuit board assembly arranged aside the first board carries the main electrical units on one side and a display device with a visible display area on the opposite side. Selector areas assigned to each one of the switches for marking selector positions are arranged on the same side of the handle body as the display area. Test prongs, selector areas and the display area may therefore be viewed together.

12 Claims, 4 Drawing Figures

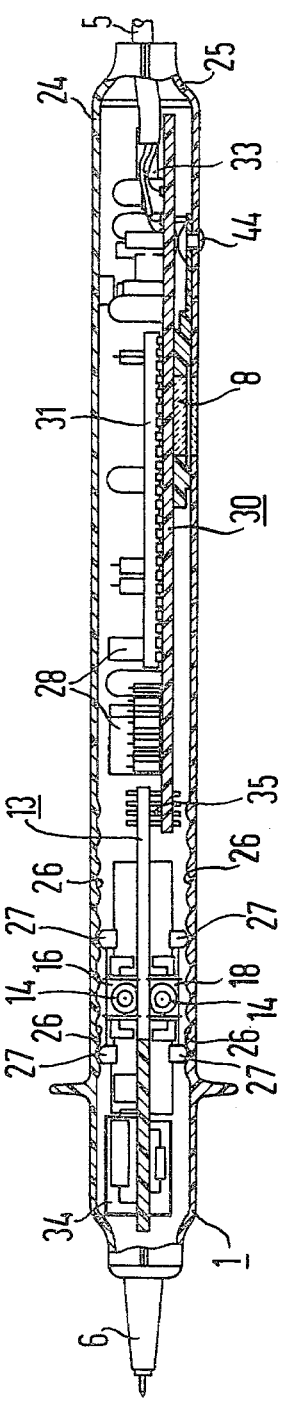

HAND HELD TESTING DEVICE FOR MEASURING DIFFERENT ELECTRICAL QUANTITIES

BACKGROUND OF THE INVENTION

The present invention is directed to a hand held testing device having means for selecting independently one of several functions and one of several ranges, respectively, for measuring different electrical quantities within a wide range of magnitudes.

Hand held testing devices are very well known in the art. Usually they are provided with two handles each having a test prong for contacting electrical measuring points. Such hand held testing devices are used for electrical testing purposes; for example, for testing if a voltage at a measuring point is present or not; and for testing short circuits or resistances of electrical connections. For displaying the test result there is provided a display device, such as a light emitting diode. Besides these inexpensive and basic testing devices, there are also others having expanded characteristics and functions. These more reliable testing devices may be able to present a display if such mentioned electrical quantities are within a specific range; however, the presently known hand held testing devices normally are not to be understood as precision measuring devices.

On the other hand, table models for measuring a-c voltages, d-c voltages or resistances have been known for a long time. These measuring devices, which are often called multi-meters, facilitate precision measurements. They are optionally selectable for measuring a specific function within different ranges, as a result. Measurements can be taken upon selecting a suitable measuring range so as to minimize measuring errors. Such table models in comparison to hand held devices have the disadvantage that they are bulky and inconvenient for a variety of applications, especially for outdoor services, such as maintaining and installing electrical equipment. On the other hand, there is a present need among service personnel and others for more sophisticated measuring devices which allow easy handling and give more precise measurement results.

SUMMARY OF THE INVENTION

It is, therefore, a main object of the present invention to improve presently used hand held testing devices and to extend the characteristics of these devices to the point of being comparable with the performance of multi-meters presently designed as table models.

Another more specific object of the present invention is to provide a hand held testing device having means for selecting independently one of several functions and one of several ranges, respectively, for measuring different electrical quantities within a wide range of magnitudes.

Still another object of the present invention is to provide a hand held testing device as above, designed in a very space-saving manner, especially as far as the means for selecting different operations and different ranges are concerned, thereby permitting use of such a compact and handy measuring instrument as a general tool for outdoor services.

Still another object of the present invention is to provide a hand held testing device as above, designed such that the setting of functions and ranges can be performed in one operation. This means especially the design of the hand held testing device in a manner which enables an operator to have the measuring points, selector areas marking a selected function and the selected range, respectively, and the display area with the result of the measurement in the same field of view.

It is to be understood that the hand held testing device also should contain an independent voltage source for the measuring operations, which is preferably designed as a chargable battery. If the battery is chargable, means for charging the same should be built into the device.

In the present invention, the hand held testing device having two handles and a connecting cable is provided with a function selecting switch and a range selecting switch, both of which are arranged in one handle. A first printed circuit board assembly mounted within the body of that handle carries two separate groups of contacting areas each assigned to one of the switches. The switches have switch frames and movable contact elements, preferably designed as contact rollers arranged in parallel thereon. By means of the switch frames, the contact elements are movable in common and stepwise between different selector positions. Finger grip elements, each one connected to one of the switch frames extend through the body of the handle at opposite sides for manually operating the respective switch. Two selector areas are arranged side by side and between the two finger grip elements on one surface of a handle for marking the settings of the switches. Additionally, a semiconductor display device is mounted in the body of that one handle, the display device having a display area arranged to be visible through the body of the handle on the same side as the mentioned selector areas. In that same handle a second printed circuit board assembly is mounted aside the first printed circuit board assembly. Both assemblies are electrically connected, preferably by metal pins which additionally stabilize the mechanical structure. The second printed circuit board assembly carries most measurement processing circuits on one side whereas the display device is arranged on the opposite side. This design results in a very space-saving structure.

The design of the selector switches is such that the switches can be implemented in a particularly space-saving and flat configuration. Preferably, the first printed circuit board assembly is utilized from both sides for providing these switching operations. Rolling contacts ensure a safe, abrasion-free and easy-to-handle operation. As both switches make use of one printed circuit board as the stationary member, the design can be such that both switches can be operated with the thumb and the index finger of one hand.

The arrangement of the electronic elements, assemblies and of the digital display on the second printed circuit board assembly provide for short electrical lines, and makes specific use of present known techniques for composing electrical and electronic units in a space-saving manner. This is also to be seen from the mutual spatial arrangement of all electronic elements and assemblies on one side of the second printed circuit board assembly, so that it occupies most space in only one direction, whereas the flat digital display device arranged on the other side of the second printed board assembly can thus be placed in a recess of the handle to be viewed from the outside.

Preferably, a measuring unit, mainly composed of a switchable measuring voltage divider having precision resistors and compensation capacitors, is mounted on the first printed circuit board assembly. This permits spatial separation of these elements from the measurement processing circuits, which is essential for measuring operations for undistorted results.

Preferably, also the display device is composed of a liquid crystal device arranged in a clamp strap embracing the second printed circuit board assembly. This clamp strap thus performs two functions, it is both a pre-assembling tool for accomodating the display device on the second printed board assembly prior to mounting the assembled unit into the body of the handle, and a very simple mounting structure for connecting the display device to the second printed circuit board assembly.

A better understanding of the invention may be had by reference to the following description of a preferred embodiment in conjunction with the accompanying drawings.

BRIEF DESCRIPTION OF THE DRAWINGS

FIG. 3 is a partial sectional view of the handle shown in FIG. 2 with a cross-section essentially along the line III—III; and FIG. 4 shows a detail of the clamp structure of the display device.

DETAILED DESCRIPTION OF THE PREFERRED EMBODIMENT

Figure 1:
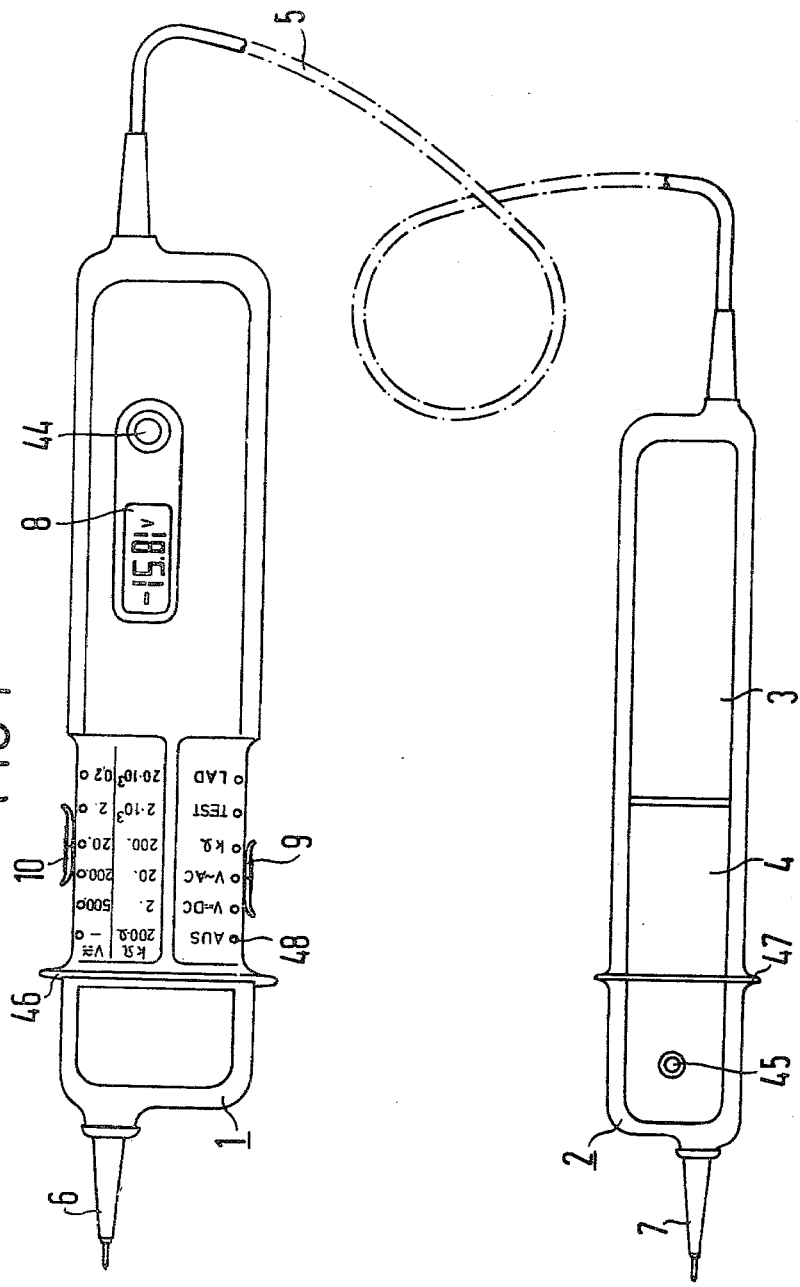
FIG. 1 is a top view of the general design structure of the testing device.

FIG. 1 shows a schematic diagram of a hand held testing device having two handles 1 and 2 and a cable 5 connecting these handles. Built into the second handle 2 there is provided a battery 3, for example consisting of four chargeable Ni-Cd cells, and an adapter set 4 for transforming a supply voltage into a charge voltage during charge operations. Each of the handles 1 and 2 are equipped with test prongs 6 and 7, respectively. The test prongs are designed in a known manner for hand held testing devices and are connected to the respective handle by a screw joint. Each of the handles 1 and 2 has a glide-off ring 46 and 47, respectively, preventing fingers from gliding off the handle in the direction of a test area with sometimes hazardous voltages. The glide-off rings 46 and 47 are thus provided for safety reasons.

A function selecting switch 9 and a range selecting switch 10 are arranged in handle 1; these two switches are represented in FIG. 1 in the form of grip levers to be operated from the outside. The function selecting switch 9 is to be set in six function positions which are represented in a function selector area. If the switch is set to the function position 48 closest to the glide-off ring 46, the device is turned off. The other function positions, mentioned in successive order, are to be selected for measuring direct current voltages (V-DC), measuring alternating current voltages (V-AC) and resistances (k ohm), for testing the battery 3 (TEST) and for charging the battery 3 (LAD). If the battery 3 has to be charged, first the function selecting switch 9 is set to the function "Charge" (LAD); then the test prongs 6 and 7 of handles 1 and 2, respectively, are connected to the supply voltage. During a charge operation a light-emitting diode 45 arranged in the second handle 2 will light up for indicating the selected function.

The range selecting switch 10 is actuated to provide for a suitable measuring range when one of the described measuring functions has to be performed. As to be seen from a second selector area arranged aside the first one, voltage measurements are to be taken in ranges from 200 to 500 V, from 20 to 199.9 V, from 2.0 to 19.99 V, from 0.2 to 1.999 V and from 10 to 199.9 mV. If resistances are to be measured, corresponding ranges are from 0.1 to 199.9 ohm, from 0.2 to 1.999 k ohm, from 2.0 to 19.99 k ohm, from 20.0 to 199.9 k ohm, from 0.2 to 1.999 M ohm and from 2.0 to 19.99 M ohm.

On the same side of the first handle 1 there also is provided a digital display device 8 designed as a liquid crystal display (LCD). The display device 8 is arranged such that an operator embracing handle 1 and touching the range selecting switch 10 with his thumb and the function selecting switch 9 with his index finger has the display device 8 in his field of view. However, sometimes this normal mode of operation is not possible if the measuring area is inconveniently located. Therefore a push button 44 is mounted aside the display device 8. By actuating the push button, measurements can also be taken at such locations where the testing device cannot be held such that the digital display device 8 is in the operator's field of view. Upon actuating the push button 44 the numerical value of measurement is stored for a sufficient period of time for the operator to remove the handle 1 from the measuring area and to read the measured values.

Figure 2:
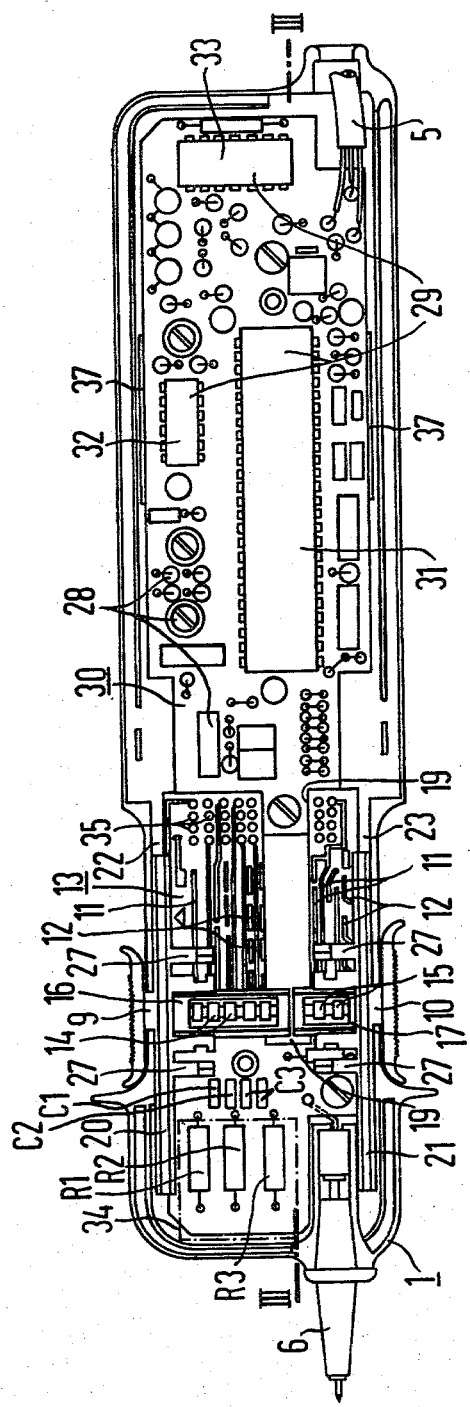
FIG. 2 is a partial sectional view of the handle containing the main electrical and electronic equipment, while a part of the handle body is removed to show the interior structure.

As it will be described in detail later, handles 1 and 2 are each composed of two half shells of a main body. FIG. 2 shows a view of the first handle 1 when one of these half shells of the main body is removed. Identical elements have the same reference numbers in the respective figures. Handle 1 is provided with two printed circuit board assemblies, a switch board 13 and a display board 30. The switch board above all carries printed conductors 11 and contacting surfaces 12, of which conductors and contacting surfaces only a selection is shown in FIG. 2 for functional clarity.

As the switch board 13 mainly forms contacting surfaces 12 for both the function selecting switch 9 and the range selecting switch 10, movable elements of these two switches are assigned to the switch board 13 arranged in a multi-layer structure. The movable elements of switches 9 and 10 are provided with contact rollers 14 having flexible surfaces of conductive material. The contact rollers may be constructed of rubber rings filled with conductive material and mounted on insulating plastic wheels or of rolling metalic rings of soft material. Thus an intimate area contact is obtained between neighboring contacting surfaces 12 across the surface of contact rollers 14. Groups of contact rollers 14 are commonly arranged in a first switch frame 16 and a second contactual switch frame 17, respectively.

Since both sides of the switch board 13 are used, as can be seen from the cross-sectional view of the handle 1 shown in FIG. 3, respective contact rollers 14 are also arranged on the opposite side of the switch board 13. These contact rollers are likewise grouped to form second sets of contact rollers for each of both the function selecting switch 9 and the range selecting switch 10. A third switch frame 18 forms the housing for one of these second sets of contact rollers. The respective fourth switch frame aligned to the third switch frame 18 and forming the housing of the second set of contact rollers is not visible in this partial sectional view of FIG. 3. Switch frames are pressed on the switch board 13 by spring pressure. The first and third switch frames 16 and 18 are assigned to the range selecting switch 10 whereas the second and fourth switch frames are assigned to the fucntion selecting switch 9.

A slot 19 running parallel to the contacting surfaces 12 is formed in the switch board 13 to separate the contacting areas of both the function selecting switch 9 and the range selecting switch 10. The slot 19 extends over the entire operating range of the two switches 9 and 10 and is provided for separating the two switch areas which are to be operated independently. Each pair of switch frames assigned to switch 9 and 10, respectively, is connected with a slide lever 20 or 21 running along respective sliding rail tracks 22 or 23 in two housing parts 24 and 25 forming the body of the handle 1. This insures reliable guidance of the finger grip levers of both switches and positive contacting of the contact rollers 14 onto the contacting surfaces 12. For locking the slides 20 and 21 at specific stop locations resilient locking arms 27 are provided in depressions 26 in the interior of the housing parts 24 and 25, respectively, which arms move with slides 20 and 21. The specific stop locations correspond to a given setting of the switches for defining a specific function range and measurement range.

The switch function board 13 is designed mainly to perform the switching operations. The display board 30 is the main board for mounting electronic circuit components 28 and 29 performing measurement processing functions and for mounting the display device 8. The display board 30 may also be composed of several layers bearing printed conductors for inter-connection of the circuit components and the display device.

The electronic circuit components 29 are standard, commercially-availalbe integrated modules. An analog-to-digital converter 31 is designed as a LSI-CMOS circuit. This converter 31 insures great resistance to aging, reliability and allows for automatic zero-point correction. The converter 31 is connected with other passive and active electronic elements 28 with a quadruple operational amplifier 32, a dc-ac transformer 33 and the display device 8. The electrical design is well known to those skilled in the art of multi-purpose testing devices so that further detailed description does not seem to be necessary.

The improved mechanical structure of the display device 8 is to be seen from the 3-dimensional view of FIG. 4. The commercially available display device 8, designed as a liquid crystal display, is arranged in a clamp strap 36 having two arms 38 extending perpendicular to the long axis of the strap. Each arm of the clamp strap 36 is provided at its end with a catch 37 embracing thus the display card 30. In the center part of the clamp strap 36 there is provided a window opening 39 having extending wall portions 40. These wall portions only serve to receive rubber strips 41 having a high electrical resistance in the longitudinal direction and bearing electrically conductive sections in the transverse direction. Thus, contact points of the display device 8, which are provided to control independently operating character sections of the display device, can be contacted with respective contact surfaces 42 of conductors 43 of the display card 30. The appropriate contact forces are achieved by the rubber strips 41 which under pressure by the clamping force of clamp strap 36 on the display card 30. Besides giving contact between the display card 30 and the display device 8 the rubber strips 31 also are provided for an elastic buffering holding action of the display device 8.

The design of the clamp strap 36 not only ensures an extremely space-saving accomodation of the display device 8 on the display card 30, but also serves as an assembling device. In assembling of the testing device, the display device 8 is first inserted into the window opening 39, then the two laminated contact-rubber strips 41 are laid in and held laterally by the wall portions 40 in the window opening. Then the display card 30 can be pressed on this arrangement. The display device 8 is adjusted by lateral displacement in the longitudinal direction of the display card 30 for correct positioning. The display device 8 is mounted directly opposite to the analog-to-digital converter 31, this design forming an electrically optimal and space-saving circuit arrangement. The clamp strap 36 also is provided for inserting a key contact 44 for easy assembly together with the display device 8.

The switch board 13 adjoins the display board 30 in the longitudinal direction of the handle 1 and is fixed to the body of the first handle in a position which is staggered in height in reference to that of the display board 30. Both printed circuit boards are electrically connected to each other by metal pins 35 consolidating also the mechanical structure. It goes without saying that the interior of the two housing parts 24 and 25 of the first handle are so designed that these parts enhance the vertically staggered position of the two printed circuit board assemblies.

Additionally, on the switch board there is mounted a switchable measurement voltage divider formed of several position resistors R1, R2, R3, etc. and compensation capacitors C1, C2, C3, etc. The capacitors serve for correcting the frequency response of the testing device. This voltage divider 34 is also connected to the metal pins 35 by connecting lines and is thus connected to the second printed circuit board assembly.

A special advantage of the present invention, due to the constructional design of the interior of the first handle, is that this hand held testing device is provided with three measurement functions—i.e., measurements of d-c voltage, a-c voltage, and resistance—and with two more functions for battery test and charging. Optimal measurement results are to be had by selecting an appropriate measuring range for each measuring function. The hand held testing device, therefore, offers all functions of a conventional table model testing device. The necessary electrical circuitry for performing all of these characteristics is achieved with particularly small dimensions. In an actual design, the first handle 1 has a housing dimension of $185 \times 44 \times 17$ mm$^3$ without the test prong, and the second handle has respective housing dimensions of $135 \times 32 \times 16$ mm$^3$.

All settings of both the function selecting switch 9 and the range selecting switch 10 can be effected during measuring processes. The switches are set by fingers of the hand holding the first handle, with the display device remaining in the field of view.

Both the switch board and the display board 30 are fixed in the body of the first handle by means of screws which are fixed in a self-tapping manner on one housing part 25 of the handle 1, thus supporting the mechanical stability of the entire arrangement of the handle. The housing parts 24 and 25 of the handle 1 have overlapping rims ensuring proper creep distances required in an electrical measuring instrument. These rims are designed as to perform a self-snapping property when assembled together. This design keeps the handle relatively dust-proof with sufficiently long creep distances for electrical safety and reliability. As an additional feature, the use of contact rollers 40 constructed of rubber and the rubber strips 41 holding the liquid crystal display make the testing device shock proof so that it is highly insensitive to mechanical shocks.

While the specific design of the testing device herein described constitutes a perferred embodiment of the invention, it is to be understood that the invention is not limited to this precise form of assembly, and that a variety of changes may be made therein without departing from the scope of the invention.

I claim:

1. A hand held testing device having means for selecting independently one of several functions and one of several ranges, respectively, for measuring different electrical quantities within a wide range of magnitudes, comprising in combination:
   (a) a first handle, a second handle and a cable connecting the two handles, each of said handles being provided with a hollow body for accomodating electrical units and with a test prong for contacting a respective measuring point;
   (b) a function selecting switch and a range selecting switch both arranged on said first handle; a first printed circuit board assembly mounted within the body of said first handle and carrying two separate groups of contacting areas assigned to said function selecting switch and to said range selecting switch, respectively; each of said switches further having a switch frame and movable contact elements arranged in parallel thereon and being movable in common and stepwise, between different selector positions, in the direction of the long axis of said first handle, and when in a selector position, being in close contact with respective neighboring contact areas; each of said switch frames having a finger grip element extending through said first handle body at opposite sides for manual operation of the respective switch;
   (c) two selector areas arranged side by side and between the two finger grip elements on one surface of said first handle, the first selector area marking selector positions of said function selecting switch and the second selector area marking selector positions of said range selecting switch;
   (d) a semiconductor display device mounted in said body of said first handle, and having a display area arranged to be visible through the body of said first handle on the same side of said first handle as said selector areas;
   (e) a second printed circuit board assembly mounted aside said first printed circuit board assembly in said body of said first handle and electrically connected to said first printed circuit board assembly, said second printed circuit board assembly carrying measurement processing circuit arrangements on one surface and means for connecting the display device to outputs of said measurement processing circuit arrangements arranged on the opposite surface; and
   (f) a chargable voltage source unit and means for charging the same built into said second handle.

2. The hand held testing device recited in claim 1, both the function selecting switch and the range selecting switch further comprising a pair of switch frames with movable contact elements arranged symmetrically to the first printed circuit board assembly and commonly connected with the respective finger grip elements; and contacting areas assigned to one of each switches mounted on opposite sides of said first printed circuit board and being engagable with a respective one of said movable contact elements.

3. The hand held testing device recited in claim 2, wherein the movable contact elements of both the function selecting switch and the range selecting switch are constructed of contact rollers arranged concentrically and in parallel on a respective switch frame and having a flexible surface of conducting material.

4. The hand held testing device recited in claim 3, wherein said contact rollers further comprise an outer rubber ring filled with conductive material and mounted on an insulating wheel of plastic material.

5. The hand held testing device recited in claim 4, comprising:
   (a) sliding rail tracks arranged in side portions of the body of the first handle adjacent to the first printed circuit board assembly; and
   (b) a pair of slide levers, each mounted on the switch frames of the function selecting switch and a range selecting switch, respectively, and each arranged in a sliding position in one of said sliding rail tracks for aligning the respective switch to the long axis of the first printed circuit board assembly.

6. The hand held testing device recited in claim 5, further comprising:
   (a) sets of depressions, each arranged in a line parallel to the long axis of the first printed circuit board assembly on the interior surface of the body of the first handle; and
   (b) locking arms resiliently mounted on each slide lever for spring loaded engagement with said depressions for optionally setting the respective switch in different selector positions.

7. The hand held testing device recited in claim 6, wherein the two printed circuit board assemblies are mounted in a staggered position with overlapping edges in the body of the first handle and wherein said testing device further comprises metal pins for electrically connecting a multiplicity of respective connecting lines of both printed circuit board assemblies.

8. The hand held testing device recited in claim 7, wherein the first printed circuit board assembly further comprises a measuring voltage divider unit switchable between different stages by the range selecting switch, and electrically connected with the electrical units mounted on the second printed circuit board assembly.

9. The hand held testing device recited in claim 8, further comprising a clamp strap having two bent arms with end portions forming resilient shoulders, and having extending wall portions forming an opening in the center part; said shoulders embracing the second printed circuit board assembly and the display element arranged between the clamp strap and the second printed circuit board assembly in a locked position under pressure of the clamp strap.

10. The hand held testing device recited in claim 9, further comprising rubber strips having high electrical resistance in the longitudinal direction and bearing electrically conductive sections in the transverse direction arranged between the display device and the second printed board assembly and clamped into position by the extending wall portions of the clamp strap; whereby the conductive sections of said rubber strips form electrical connections between respective connection areas of the second printed circuit board assembly and input contact points of the display device.

11. The hand held testing device recited in claim 10, wherein the semiconductor display device comprises a liquid crystal digital display element.

12. The hand held testing device recited in claim 11, wherein both handles further comprise a glide-off ring circumferentially extending from the surface of the handles and located adjacent to the respective test prong.

* * * * *